May 11, 1965 H. E. GOETZ 3,183,414

NOISE SUPPRESSOR SYSTEM

Filed Feb. 14, 1962

INVENTOR.
Heinz E. Goetz
By Smyth, Roston & Pavitt
Attorneys 3,183,414

NOISE SUPPRESSOR SYSTEM

Heinz E. Goetz, Ontario, Calif., assignor to Packard-Bell Electronics Corporation, Los Angeles, Calif., a corporation of California Filed Feb. 14, 1962, Ser. No. 173,616
8 Claims. (Cl. 317—138)

Figure 1:
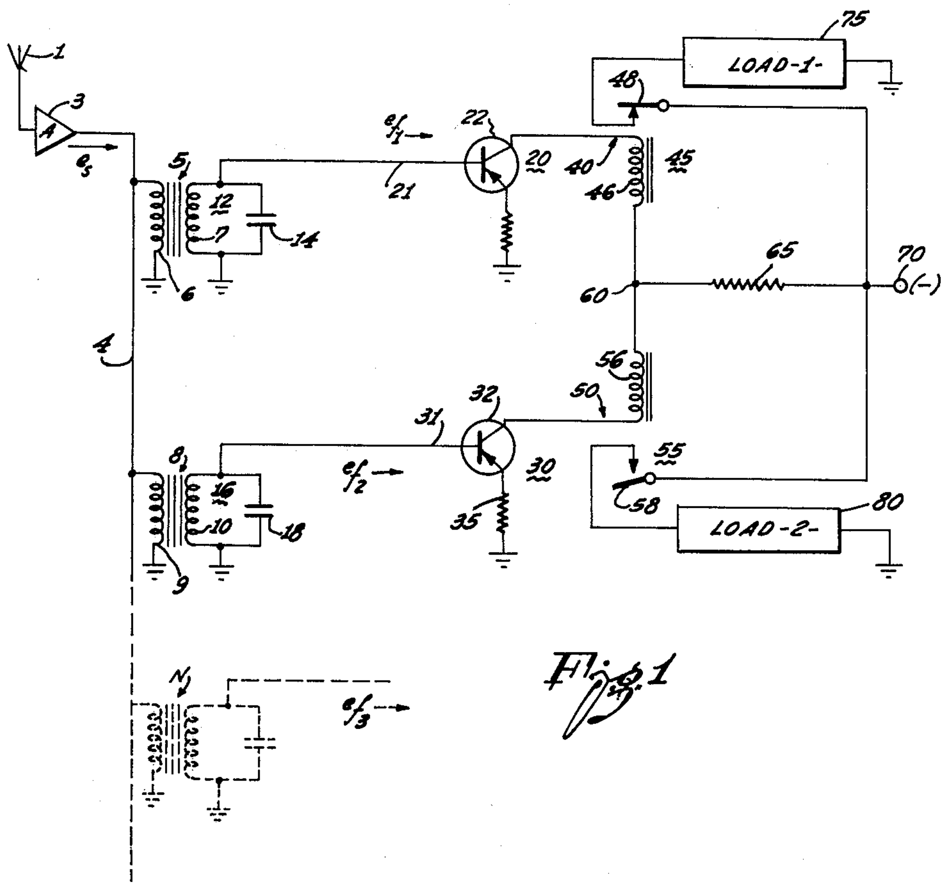

This invention relates to a unique noise-immune, control circuit responsive selectively to any one or more, but not all of a plurality of electrical input signals of predetermined, mutually-differing frequencies to control at least one of a plurality of relays, or other devices, but inoperative to control any of the devices in response to more than a predetermined number of the signal frequencies presented simultaneously. Thus, the control circuit of this invention will not respond to electrical noise, because the latter will be comprised of more than the predetermined number of input signals. This will be the case because, as is well known in the art, electrical noise is made up of electrical-wave components of random occurrence, amplitude, and frequency throughout a very wide band of the frequency spectrum.

In general, the control circuit of this invention utilizes a plurality of electronic switches having load circuits coupled in parallel, and in series with a voltage or current-limiting resistor between power input terminals. Each switch is provided with a load-circuit control element coupled to an input circuit tuned to one of the input-signal frequencies, and the relays, or other controlled devices, have their respective control members coupled to the load circuits of the switches.

It should be apparent, therefore, that the voltage and current available for the parallel-coupled load circuits of the switches will be determined by the voltage and current drop across the limiting resistor. Likewise, the current and the voltage loss across the limiting resistor will be determined by the number of closed load circuits. Hence, by biasing the relays or other controlled devices to respond only when the load current or voltage satisfies a threshold requirement, it is possible to condition the control circuit to operate only when then number of input signals does not exceed a predetermined number less than the total. If all input signals are received at the same time, as would be the case in the presence of a burst of electrical noise, all switches will close, and the voltage or current available to the load circuits will not rise to the threshold level.

Among the important applications of noise-immune control circuits in accordance with this invention, are those involving the control of relays, or other devices, by electromagnetic signals transmitted from a point remote from the location of the control circuit. For example, one of the more important uses of this invention is in remote control systems for television receivers. In a system of this type, the control circuit would be located at the receiver, and the control elements of the various electronic switches would be coupled respectively to appropriate circuits tuned to the signal frequencies transmitted from a remote control unit operated by the televiewer. The control circuit would insure that spurious signal frequencies or electrical noise in the vicinity of the television receiver would have no effect on its operating conditions, as established through operation of the remote control unit by the televiewer.

It should be understood, of course, that the relays, or other devices, controlled by the control circuit would have the effect of turning the television set on or off, changing its video-channel setting, increasing the volume up or down, adjusting picture contrast, and so forth. Hence, unless the receiving unit of the remote-control system is rendered immune to the effects of electrical noise, a strong possibility exists that the receiver would respond to components of the electrical noise corresponding to the input signal frequencies. Accordingly, the televiewer would be somewhat annoyed and frustrated as a result of undesired alterations in the operating conditions of the television receiver.

Although many noise-immune electrical control circuits are known to the prior art, none has embodied the novel structure, simplicity, flexibility, or functional advantages of this invention. For example, one of the control circuits known to the prior art achieves immunity to the effects of electrical noise through the use of a receiving circuit tuned to a desired signal frequency, a normally-closed electronic switch having its load circuit coupled between the tuned receiving circuit and the device to be controlled, and a second receiving circuit turned to another frequency and coupled to the control element of the electronic switch to interrupt the load circuit of the switch and render the controlled device inoperative whenever an undesired, or electrical noise frequency is received by the second tuned circuit. The principal disadvantage of this arrangement is that the second tuned circuit cannot be utilized to control a second device, because its function is limited solely to control of a load circuit regulating operation of the controlled device.

Another noise-immune control circuit typical of the prior art involves the use of circuitry for detecting signals of desired frequency as well as those of an unwanted, or noise, frequency, and differentially combining the detected signal and noise voltages, so that the former will be reduced below a threshold magnitude for operation of the controlled device at a predetermined ratio of the two signals.

It should be apparent that the prior-art control circuits described above utilize two tuned circuits for each controlled device. This obviously is disadvantageous, and contrasts with the simplicty of this invention which requires only one tuned input circuit and one electronic switch for each controlled device, or set of devices. Furthermore, the magnitude of the voltage or current available to effect control of the relays or other devices is not related to the corresponding amplitudes of the input signals, but are related to the number of input signals. As long as the number of input signals is equal to or less than the predetermined number required for the existence of a voltage or current at least equal to the threshold magnitude to which the controlled devices will respond, and the amplitude of the input signals is sufficient to close the electronic switches, the control circuit of this invention is operative. This means that the amplitudes of the incoming input signals may vary considerably without having any effect whatsoever on the magnitude of the voltage or current applied to the control members of the controlled devices.

A preferred embodiment of this invention utilizes two or more parallel-resonant networks tuned respectively to different signal frequencies. The parallel-resonant networks are coupled inductively to an input circuit comprised of an antenna, a radio-frequency amplifier, and a plurality of transformers having primary windings coupled in parallel between the output of the amplifier and a ground source of constant potential; the secondary windings of these transformers constitute the inductive elements of the parallel-resonant networks.

Whenever the signals supplied by the input circuit are of sufficient amplitude and proper frequency, the parallel-resonant networks develop sufficient A.-C. voltage to actuate corresponding control elements of the electronic switches. Each of the two or more electronic switches comprises a transistor coupled in the common-emitter configuration, and having its base utilized as a switch-control element coupled directly to one of the parallel-resonant networks, its emitter coupled degeneratively via a resistor to a ground source of constant potential, and its collector coupled to one end of the winding of an electromechanical relay. A current or voltage-limiting resistor is coupled between a power input terminal and the respective other ends of the relay windings.

Hence, each of the electronic switches controls one of a plurality of load circuits coupled in parallel between the current of voltage-limiting resistor and the ground source of constant potential. Each load circuit is comprised of the series-connected combination of a relay winding, the collector-emitter path of the transistor switch, and the emitter resistor. The relay of each load circuit may control the application of electrical power to a load.

It should be understood, of course, that solid state relays may be used in lieu of electro-mechanical relays, or other devices responsive to pre-established threshold magnitudes of voltage or current may be utilized in lieu of relays. Moreover it will be apparent that wherever alternating electrical signals are present in the control circuit, these may be rectified and integrated to provide unidirectional voltages where so desired. Moreover, any one of the load circuits may control a plurality of devices, or one device may be controlled by a plurality of load circuits.

Figure 2:
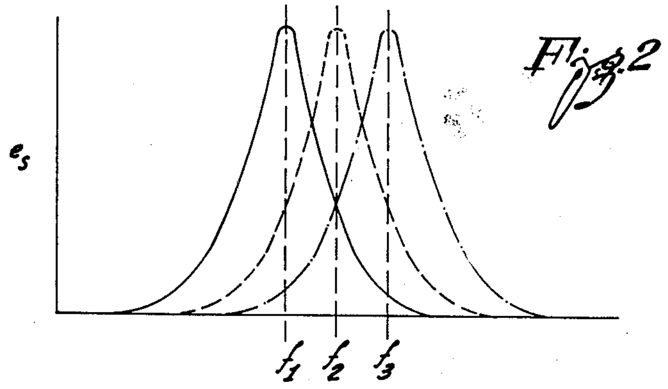

The foregoing paragraphs are intended to summarize and explain the significance of this invention in relation to the problems which it resolves, and should not be construed to narrow the scope of protection provided by the claims. For a more complete understanding of the structure, operation and novel features of an embodiment of this invention, consider the following description with reference to the drawings, wherein:

FIG. 1 represents schematically the circuit configuration of a noise-immune, frequency-responsive control circuit in accordance with this invention; and FIG. 2 represents typical frequency versus signal-amplitude curves for parallel-resonant networks suitable for use in the embodiment of FIG. 1.

The embodiment of this invention represented in FIG. 1 generally includes an input circuit made up of an antenna 1 for receiving electromagnetic radiations, a radio-frequency amplifier having an output conductor 4, and the primary windings 6 and 9, of a plurality of transformers 5 and 8, coupled in parallel between the output conductor 4 and the ground source of constant potential. A plurality of parallel-resonant networks 12 and 16 are coupled inductively to the primary windings 6 and 9 and a plurality of electronic switches 20 and 30 having respective control elements 21 and 31 are coupled respectively and directly to the parallel-resonant networks 12 and 16. Controlled load circuits 40 and 50, coupled between a common terminal 60 and the ground source of constant potential, respectively, include the switches 20 and 30 and the windings 46 and 56 of electro-mechanical relays 45 and 55. A current-limiting resistor 65 is coupled between the common terminal 60 and a power-supply terminal 70 for a source (not shown) of unidirectional negative voltage.

It should be understood that the power-supply terminal 70 and the ground source of constant potential represented in the drawings are to be coupled across the terminals of a unidirectional power supply (not shown). Hence, the ground source of constant potential may be regarded as a second power input terminal.

The amplifier 3 of the input circuit may be any one of a number of conventional circuits for increasing the amplitude of radio frequency signals. For this reason, a detailed schematic and description of this component is deemed unnecessary.

The transformer and parallel-resonant network, represented in dotted lines denoted N indicate that an indefinite number of tuned networks and electronic switches having respective load circuits coupled in parallel with load circuits 40 and 50 may be added to the embodiment represented in FIG. 1.

The parallel-resonant network 12 is comprised of an inductor formed by the secondary winding 7 of the transformer 5, and a capacitor 14 coupled in parallel between switch control element 21 and the ground source of reference potential. The parallel-resonant circuit 16 is formed in a similar manner, and includes the secondary winding 10 of transformer 8 and the capacitor 18 coupled in parallel between control element 31 and the ground source of reference potential.

The parameters of the parallel-resonant networks 12 and 16, together with the inductive coupling between the primary and secondary windings of the transformers 5 and 8, are chosen to have respective peak-signal responses as closely spaced as practicable. In addition, it is desirable that these networks have very high Q's in order to enhance discrimination between closely-spaced input signal frequencies. It is desirable to have the parallel-resonant networks 12 and 16 responsive to closely-spaced peak input-signal frequencies to make certain that a particular burst of electrical noise received by the antenna 1 will contain frequency components corresponding to each of the frequencies to which the parallel-resonant networks are tuned. As will become more apparent below, this is necessary to insure that the control circuit of this invention will be immune to electrical noise and other spurious signals.

Inasmuch as the electronic switches 20 and 30 are similar in structure and operation, only the electronic switch 20 will be described in detail. This switch is comprised of a PNP transistor 22 coupled in the common-emitter configuration. The base of transistor 22 is coupled to the parallel-resonant network 12, and its collector-emitter path, together with a degeneratively-coupled, emitter-biasing resistor 25, are in the load circuit 40 controlled by the transistor switch 20.

The transistor switch 30 is substantially the same as switch 20 described above.

The parallel load circuits 40 and 50 of the transistor switches 20 and 30 are comprised of the windings 46 and 56 of relays 45 and 55 in series with the respective collector-emitter paths and the degenerative-biasing resistors 25 and 35 of transistors 22 and 32.

The current-limiting resistor 65 is coupled in turn, between the power input terminal 70 and the common terminal 60 of parallel load circuits 40 and 50. The size of resistor 65 is chosen so that sufficient current will flow to energize either relay 45 or 55 whenever the corresponding transistor switch 20 or 30 is closed by an input signal having a frequency to which the corresponding parallel-resonant networks 12 or 16 is tuned. However, when electrical noise having components of the same frequency as the input signals to which all of the plurality of parallel-resonant networks 12 and 16 are tuned is received by the antenna 1, and both transistor switches 20 and 30 close, the current from the power-input terminal 70 through the current-limiting resistor 65 divides through the parallel load circuits 40 and 50, and neither current will be of sufficient magnitude to operate the relays 45 or 55. Accordingly, the control circuit of FIG. 1 is immune to an electrical noise input or the simultaneous input of both input signal frequencies required to close switches 20 and 30.

Stated more generally, the size of the current-limiting resistor 65 is chosen so that simultaneous closure of any number of switches less than all, but more than a predetermined number, will result in a magnitude of current in the respective load circuits of these switches too small to actuate relays, or other controlled devices. It should be understood that the preceding general statement may be made in terms of voltages rather than currents, and would be equally valid. Furthermore, the controlled devices may be solid state relays, or other voltage-operated devices, rather than the electro-mechanical relays 45 and 55 utilized in the embodiment of FIG. 1.

The loads 75 and 80, coupled respectively between the power-input terminal 70 and a ground source of constant potential, are included in FIG. 1 merely for clarity, and are shown to be controlled by the respective relay contacts 48 and 58 of relays 45 and 55. Moreover, persons skilled in the art will recognize that many other types of switches may be used in lieu of the transistor switches 20 and 30.

The representations in the drawings and text are intended merely to facilitate the practice of this invention by persons skilled in the art, not to restrict its scope. Moreover it is obvious that many circuit variations and substitutions may be made with respect to the specific embodiment described above while remaining within the ambit of this invention as delineated in the following claims.

I claim:

1. A control circuit selectively responsive to at least one electrical signal of predetermined frequency comprising:

input terminals for electrical power;

a current-limiting device coupled to one of the power input terminals;

first and second switches, each having a controllable load circuit coupled between the current-limiting device and the other power-input terminal, and a control element responsive to an alternating electrical signal for controlling the flow of electrical current in the load circuit;

first and second controllable devices, each having a control member responsive to an electrical operating signal, and coupled effectively between the current-limiting device and a different one of the respective load circuits of the first and second switches;

first means coupled between the signal-input terminal and the control element of the first switch for selecting only one input signal of a first predetermined frequency for actuating the latter to produce the operating signal for the control member of the first device; and second means coupled between the signal-input terminal and the control element of the second switch for selecting only an input signal of second predetermined frequency for actuating the latter to produce the operating signal for the control member of the second device.

2. A control circuit for N controllable devices, and responsive to one or more of a predetermined number less than N electrical input signals of predetermined, mutually-differing frequencies to operate corresponding controllable devices, where N represents a whole number, but inoperative to control any devices in response to a number of input signals exceeding the predetermined number, said control circuit comprising:

a signal input terminal;

a pair of electrical-power input terminals;

N switches, each including a control element responsive to an electrical operating signal, and a portion of a load circuit having one terminus coupled to one of the power-input terminals, and another terminus coupled in common to another termini of the load circuits to form a plurality of parallel load circuits;

a plurality of controllable devices having control members operative only in response to an electrical quantity of predetermined magnitude, and effectively coupled, respectively, to the commonly-coupled termini of the load circuits of the switches;

a plurality of means for developing switch-operating signals having respective input elements coupled to the signal-input terminal and output elements coupled, respectively, to the control elements of the switches, and each of the plurality of means responsive selectively only to an electrical input signal having a predetermined frequency differing from the response frequencies of the other means; and means coupled effectively between another termini of the switch load circuits and the other power input terminal for limiting the electrical quantity to a value below the magnitude of the predetermined electrical quantity whenever the simultaneous occurrence of a multiplicity of input signals results in simultaneous operation of at least two of the switches.

3. A control circuit immune to electrical noise for N controllable devices, and responsive selectively to one or more of a predetermined number less than N electrical-input signals of predetermined, mutually-differing frequencies to operate corresponding controllable devices, where N represents a whole number, but inoperative to control any of the devices in response to a number of simultaneous input signals exceeding the predetermined number, the said control circuit comprising:

a pair of power input terminals and a common terminal;

means having N output conductors for providing input signals of predetermined frequency, where N represents a whole number;

N switches, each having a control element coupled to a separate one of the N output conductors, and a circuit controllable by the control element;

N load circuits including, respectively, the controllable circuits of the N switches and coupled in parallel between one of the power-input terminals and the common terminal;

a plurality of devices having control members coupled to the parallel load circuits, and operative in response to respective electrical quantities exceeding at least a single predetermined magnitude;

and means coupled in series with the parallel-load circuits between the power-input terminals for limiting the electrical quantities to respective magnitudes less than the at-least single, predetermined magnitude whenever, as in the case of an electrical noise supplied by the providing means, the number of input signals exceeds a predetermined number less than N.

4. An electrical noise-immune control circuit for one or more controllable devices, and responsive selectively to any one of at least two electrical input signals of predetermined, mutually differing frequencies to operate the controllable devices, but ineffective to operate any device in response to simultaneous input signals exceeding a predetermined number greater than one and less than all of the input signals, said control circuit comprising:

at least two parallel circuit branches for controlling the controllable devices;

at least two switches responsive to electrical operating signals, and connected in the parallel circuit branches for controlling, selectively, the respective electrical conditions of the latter;

at least two means coupled to the switches, and responsive, respectively, to at least one of a plurality of electrical-signal components of predetermined and mutually-differing frequencies, respectively, for developing at least two electrical input signals; and means coupled in series with the parallel-circuit branches for preventing simultaneous operation of more than a predetermined number greater than one and less than all of the switches.

5. A control circuit immune to electrical noise for N controllable devices, and responsive selectively to one or more of a predetermined number less than N electrical-input signals of a predetermined, mutually-differing frequencies to operate corresponding controllable devices, where N represents a whole number, but inoperative to control any of the devices in response to a number of simultaneous input signals exceeding the predetermined number, the said control circuit comprising:

a pair of power input terminals and a common terminal;

means having N output conductors for providing input signals of predetermined frequencies, where N represents a whole number;

N switches, each having a control element coupled to a separate one of the N output conductors, said switches being interconnected with said means and said power terminals by a limiter, said limiter being effective to permit said switches to be actuated in response to a limited number of input signals and to prevent the actuation of switches in response to a maximum number of signals, and a circuit controllable by the control element;

N load circuits including, respectively, the controllable circuits of the N switches and coupled in parallel between one of the power-input terminals and the common terminal;

a plurality of devices having control members coupled to the parallel load circuits, and operative in response to respective electrical quantities exceeding at least a single predetermined magnitude for controlling a plurality of devices in response to a predetermined electrical condition of the load circuits.

6. An electrical noise-immune control circuit for one or more controllable devices, and responsive selectively to any one of at least two electrical input signals of predetermined, mutually-differing frequencies to operate the controllable devices, but ineffective to operate any device in response to simultaneous input signals exceeding a predetermined number greater than one and less than all of the input signals, the said control circuit comprising:

at least two parallel circuit branches for controlling the controllable devices;

at least two electronic switches responsive to electrical operating signals and connected in the parallel circuit branches for controlling, selectively, the respective electrical conditions of the latter;

at least two means coupled to the switches, and responsive, respectively, to at least one of a plurality of electrical-signal components of predetermined and mutually-differing frequencies, respectively, for developing at least two electrical input signals; and a limiting resistor coupled in series with the parallel-circuit branches for preventing simultaneous operation or more than a predetermined number greater than one and less than all of the switches.

7. An electrical noise-immune control circuit for one or more controllable devices, and responsive to any one or more of N electrical signals of predetermined, mutually-differing frequencies to operate selectively the controllable devices, where N represents a predetermined whole number greater than one and less than a whole number X representing the total number of input signals, but ineffective to operate any device in response to a number of simultaneous input signals exceeding N, the said control circuit comprising:

a pair of power-input terminals;

an input circuit;

X parallel-resonant circuits coupled inductively to the input circuit, and tuned, respectively, to predetermined, mutually-differing frequencies, for developing X input signals;

X transistor switches, each having a base constituting a switch-control element coupled to a corresponding one of the X parallel-resonant circuits, and an emitter and a collector constituting a collector-emitter circuit;

X emitter resistors coupled between the respective emitters of the switches and one of the power-input terminals;

X controllable devices, each having a control member coupled effectively to a corresponding one of the collectors, and operable in response to an electrical quantity of predetermined magnitude;

a common terminal formed by interconnecting the respective control members to form X parallel circuit branches, each including at least an emitter resistor, and a collector-emitter circuit coupled in series between the one power-input terminal and the common terminal; and a resistor coupled between the common terminal and the other power-input terminal to preclude the existence of the respective electrical quantities whenever the number of input signals exceeds N, as normally would be the case in the presence of an electrical noise supplied by the input circuit.

8. An electrical noise-immune control circuit for one or more relays, and responsive to any one or more of N electrical signals of predetermined, mutually-differing frequencies to operate selectively the relays, where N represents a predetermined whole number greater than one and less than a whole number X representing the total number of input signals, but ineffective to operate any device in response to a number of simultaneous input signals exceeding N, the said control circuit comprising:

a pair of power-input terminals;

an input circuit;

X parallel-resonant circuits coupled inductively to the input circuit, and tuned, respectively, to predetermined, mutually-differing frequencies, for developing X input signals;

X transistor switches, each having a base constituting a switch-control element coupled to a corresponding one of the X parallel-resonant circuits, and an emitter and a collector constituting a collector-emitter circuit;

X emitter resistors coupled between the respective emitters of the switches and one of the power-input terminals;

X relays, each having a control winding coupled between a corresponding one of the collectors of the X transistor switches and a common terminal formed by interconnecting effectively common extremities of the control windings, and responsive to an electrical current of predetermined magnitude to operate the relay; and a resistor coupled between the common terminal and the other power-input terminal to preclude the existence of the respective electrical currents whenever the number of input signals exceeds N, as normally would be the case in the presence of an electrical noise supplied by the input circuit.

References Cited by the Examiner

UNITED STATES PATENTS

| | | | |
|---|---|---|---|
| 2,282,526 | 5/42 | Moore. | |
| 2,343,423 | 3/44 | Reagan | 317—155.5 |
| 2,853,357 | 9/58 | Barber. | |
| 2,871,463 | 1/59 | Beckwith | 340—171 |
| 3,027,497 | 3/62 | Carlson et al. | 317—138 X |

SAMUEL BERNSTEIN, *Primary Examiner.*